United States Patent
Lyu et al.

(10) Patent No.: US 7,014,917 B2
(45) Date of Patent: Mar. 21, 2006

(54) SILOXANE-BASED RESIN AND INTERLAYER INSULATING FILM FOR A SEMICONDUCTOR DEVICE MADE USING THE SAME

(75) Inventors: Yi Yeol Lyu, Daejeon-Shi (KR); Jin Heong Yim, Daejeon-Shi (KR); Joon Sung Ryu, Icheon-Shi (KR); Ki Yong Song, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 10/695,777

(22) Filed: Oct. 30, 2003

(65) Prior Publication Data

US 2004/0242013 A1    Dec. 2, 2004

(30) Foreign Application Priority Data

Jun. 2, 2003    (KR)    ........................ 10-2003-0035276

(51) Int. Cl.
*B32B 9/04*    (2006.01)
(52) U.S. Cl. ................... 428/447; 525/477; 528/12; 528/21; 528/35; 528/37; 427/387
(58) Field of Classification Search ................ 528/12, 528/14, 21, 35, 37; 428/447
See application file for complete search history.

(56) References Cited

U.S. PATENT DOCUMENTS

| | | | |
|---|---|---|---|
| 3,615,272 A | | 10/1971 | Collins et al. |
| 4,399,266 A | | 8/1983 | Matsumura et al. |
| 4,756,977 A | | 7/1988 | Haluska et al. |
| 4,999,397 A | | 3/1991 | Weiss et al. |
| 5,010,159 A | | 4/1991 | Bank et al. |
| 5,468,829 A | * | 11/1995 | Bergstrom et al. ............ 528/18 |
| 5,853,808 A | | 12/1998 | Arkles et al. |
| 6,000,339 A | | 12/1999 | Matsuzawa |
| 6,232,424 B1 | | 5/2001 | Zhong et al. |
| 6,284,834 B1 | * | 9/2001 | Kirchmeyer et al. ........ 524/588 |
| 6,599,635 B1 | * | 7/2003 | Mechtel et al. ............. 428/449 |
| 6,623,711 B1 | * | 9/2003 | Lyu et al. ..................... 423/12 |
| 6,660,822 B1 | * | 12/2003 | Lyu et al. ..................... 528/35 |
| 2005/0003681 A1 | * | 1/2005 | Lyu et al. .................... 438/781 |

FOREIGN PATENT DOCUMENTS

EP    0 997 497 A1    3/2000

* cited by examiner

*Primary Examiner*—Marc S Zimmer
(74) *Attorney, Agent, or Firm*—Harness, Dickey & Pierce, PLC

(57) ABSTRACT

Disclosed herein are a siloxane-based resin having novel structure and an interlayer insulating film for a semiconductor device formed using the same The siloxane-based resins have so low dielectric constant in addition to excellent mechanical properties, heat-stability and crack-resistance that they are useful materials for an insulating film between interconnect layers of a semiconductor device.

10 Claims, No Drawings

SILOXANE-BASED RESIN AND INTERLAYER INSULATING FILM FOR A SEMICONDUCTOR DEVICE MADE USING THE SAME

This non-provisional application claims priority under 35 U.S.C. § 119(a) on Korean Patent Application No. 2003-35276 filed on Jun. 2, 2003, which is herein incorporated by reference.

BACKGROUND OF THE INVENTION

1. Field of the Invention

The present invention relates to a siloxane-based resin and an interlayer insulating film for a semiconductor device formed using the same. More specifically, the present invention relates to a siloxane-based resin having a novel structure and a resinous film useful as an insulating film disposed between interconnect layers of a semiconductor device.

2. Description of the Related Art

As the circuit density of multilevel integrated circuit devices increases, the size of a semiconductor device is constantly required to be reduced. The chief obstacle to the size reduction of the semiconductor device is the R(resistance)×C(capacitance) delay due to crosstalk between interconnect layers. A solution to this problem is to lower the dielectric constant of interlayer insulating films so as to decrease the R×C delay as much as possible. Accordingly, there have been various attempts to provide an insulating film having a low dielectric constant.

Conventionally, in the field of semiconductor devices, interlayer insulating films have been formed by a CVD (chemical vapor deposition) method using SiO$_2$ having a dielectric constant of 4.0. However, U.S. Pat. Nos. 3,615,272; 4,399,266; 4,756,977 and 4,999,397 disclose the formation of insulating films by a SOD(spin on deposition) method using polysilsesquioxanes having a dielectric constant of 2.5–3.1 as well as good planarization properties.

Polysilsesquioxanes as well as preparation methods thereof are well known in the art. For example, U.S. Pat. No. 3,615,272 discloses a method of preparing a completely condensed, soluble hydrogensilsesquioxane resin, which comprises the steps of condensing trichlorosilanes in a sulfuric acid medium and washing the resulting resin with water or aqueous sulfuric acid. Also, U.S. Pat. No. 5,010,159 discloses a method of synthesizing a soluble condensed hydridosilicon resin, which comprises the steps of hydrolyzing hydridosilanes in an arylsulfuric acid hydrate-containing a hydrolysis medium and contacting the resulting resin with a neutralizing agent. U.S. Pat. No. 6,232,424 describes a highly soluble silicon resin composition having excellent solution stability, which is prepared by hydrolyzing and polycondensing tetraalkoxysilane, organosilane and organotrialkoxysilane monomers in the presence of water and a catalyst. U.S. Pat. No. 6,000,339 describes that a silica-based compound is useful for improving the resistance to oxygen plasma and improving physical properties as well as the thickness of a coating film, which can be obtained by reacting a monomer selected from the group consisting of alkoxysilane, fluorine-containing alkoxysilane and alkylalkoxysilane with a titanium- or zirconium-alkoxide compound in the presence of water and a catalyst. U.S. Pat. No. 5,853,808 describes that siloxane and silsesquioxane polymers useful for forming SiO$_2$-rich ceramic coating can be obtained from hydrolysis and polycondensation of organosilanes having a β-substituted alkyl group. Meanwhile, EP 0 997 497 A1 discloses that hydrolyzation and polycondensation of a certain combination of alkoxysilanes including mono-, di-, tri-, tetraalkoxysilane and trialkoxysilane dimers can provide resinous materials for insulating films.

SUMMARY OF THE INVENTION

The present invention features the production of a siloxane-based resin having excellent mechanical properties as well as a very low dielectric constant, and the formation of a low dielectric insulating film using the siloxane-based resin.

Thus, the present invention is directed to a siloxane-based resin that is prepared by hydrolyzing and polycondensing a first monomer of the formula (1) and a second monomer of the formula (2) in an organic solvent in the presence of an acid or alkaline catalyst and water:

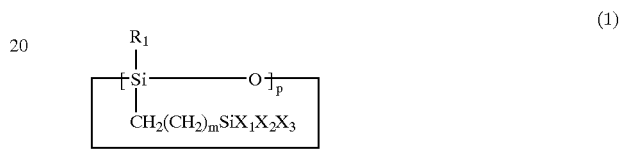
(1)

wherein,
R$_1$ is H, C$_{1-3}$ alkyl or C$_{6-15}$ aryl;
each of X$_1$, X$_2$ and X$_3$, independently, is C$_{1-3}$ alkyl, C$_{1-10}$ alkoxy or halogen, provided that at least one of them is hydrolysable;
m is an integer from 0 to 10; and
p is an integer from 3 to 8; and

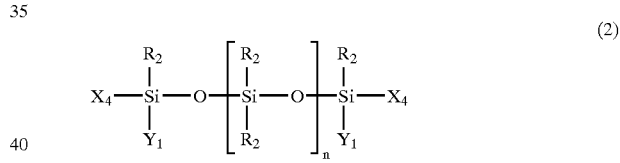
(2)

wherein,
R$_2$ is H, C$_{1-3}$ alkyl or C$_{6-15}$ aryl;
X$_4$ is C$_{1-10}$ alkoxy;
Y$_1$ is C$_{1-3}$ alkyl or C$_{1-10}$ alkoxy; and
n is an integer from 0 to 10.

Another aspect of the present invention relates to a method of forming an insulating film utilized between interconnect layers of a semiconductor device, the method comprising the steps of: providing a resin solution by dissolving the inventive siloxane-based resin in an organic solvent; coating a silicon wafer with the resin solution; and heat-curing the resulting coating film.

Still another aspect of the present invention relates to an interlayer insulating film made using the inventive siloxane-based resin.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The present invention provides a siloxane-based resin having dielectric constant of 3.0 or less through the polycondensation of a cyclic siloxane monomer of the formula (1) and a linear siloxane monomer of the formula (2):

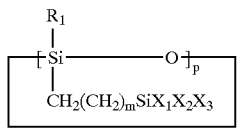

(1)

wherein, $R_1$ is H, $C_{1-3}$ alkyl or $C_{6-15}$ aryl;

each of $X_1$, $X_2$ and $X_3$, independently, is $C_{1-3}$ alkyl, $C_{1-10}$ alkoxy or halo, provided that at least one of them is hydrolysable;

m is an integer from 0 to 10; and p is an integer from 3 to 8; and

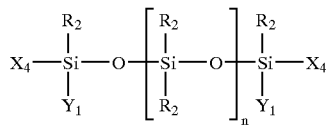

(2)

wherein, $R_2$ is H, $C_{1-3}$ alkyl or $C_{6-15}$ aryl;

$X_4$ is $C_{1-10}$ alkoxy;

$Y_1$ is $C_{1-3}$ alkyl or $C_{1-10}$ alkoxy; and n is an integer from 0 to 10.

In the preparation of the inventive siloxane-based resin, the monomer of the formula (1) and the monomer of the formula (2) are mixed in a molar ratio of 1:99–99:1.

Preferable acids or base catalysts for the preparation of the inventive siloxane-based resin can be exemplified by, but are not limited to, hydrochloric acid, nitric acid, benzene sulfonic acid, oxalic acid, formic acid, potassium hydroxide, sodium hydroxide, triethylamine, sodium bicarbonate and pyridine. Such a catalyst is used so that molar ratio of the catalyst to the monomers is 0.000001:1–10:1.

Amount of water used in the preparation of the inventive siloxane-based resin is 1–1000 mol per 1 mol of the monomers, so that molar ratio of water to the monomers is 1:1–1000:1.

Non-limiting examples of organic solvent used in the preparation of the inventive siloxane-based resin include aliphatic hydrocarbon solvents such as hexane; aromatic hydrocarbon solvents such as anisole, mesitylene and xylene; ketone-based solvents such as methyl isobutyl ketone, 1-methyl-2-pyrrolidone and acetone; ether-based solvents such as cyclohexanone, tetrahydrofuran and isopropyl ether; acetate-based solvents such as ethyl acetate, butyl acetate and propylene glycol methyl ether acetate; alcohol-based solvents such as isopropyl alcohol and butyl alcohol; amide-based solvents such as dimethylacetamide and dimethylformamide; silicon-based solvents; and mixtures thereof.

According to the present invention, the hydrolysis and polycondensation reaction is carried out at a temperature of 0–200° C., preferably 50–110° C., for 0.1–100 hrs, preferably 5–48 hrs.

The siloxane-based resin thus prepared has a Mw of 3,000–300,000. The Si—OR content in the whole terminal groups preferably amounts to more than 5mol %.

The present invention also provides a method of forming an interlayer insulating film for a semiconductor device using the inventive siloxane-based resin. The insulating film has low dielectric property below 3.0 and shows excellent mechanical and heat resistance properties. According to the present invention, such an insulating film can be obtained by coating a silicon wafer with a solution containing the inventive siloxane-based resin in an organic solvent and heat-curing the resulting coating film. That is, the inventive siloxane-based resin dissolved in an organic solvent is applied onto a substrate. Then, the organic solvent is evaporated through simple air-drying or by subjecting the substrate, at the beginning to a heat-curing step, to a vacuum condition or to mild heating at a temperature of 200° C. or less, so that a resinous coating film can be deposited on the surface of the substrate. Thereafter, the resinous coating film is cured by heating the substrate at a temperature of 150–600° C., preferably 200–450° C., for 1–150 minutes, so as to provide an insoluble, crack-free film. As used herein, by "crack-free film" is meant a film without any crack that can be observed with an optical microscope at a magnification of 1000x. As used herein, by "insoluble film" is meant a film that is substantially insoluble in any solvent described as being useful for dissolving the inventive siloxane-based resin.

According to the present invention, the combined use of a porogen with the inventive siloxane-based resin may further lower the dielectric constant of the final insulating film down to 2.50 or less. As used herein, by "porogen" is meant any pore-generating compounds. In case of using porogen, an additional step is required of heating the resinous film over the decomposition temperature of the porogen so that the porogen can be decomposed.

The porogen used in the present invention may be any of the pore-generating compounds well know in the art, which can be exemplified by, but are not limited to, cyclodextrin, polycaprolactone, and derivatives thereof. The porogen is mixed with the inventive siloxane-based resin so that weight ratio of the porogen to the resin is 1:99–70:30, wherein both porogen and resin are in the form of a solid powder.

Preferred organic solvents for the dissolution of the siloxane-based resin or the porogen to provide a liquid coating composition can be exemplified by, but are not limited to, aliphatic hydrocarbon solvents such as hexane; aromatic hydrocarbon solvents such as anisole, mesitylene and xylene; ketone-based solvents such as methyl isobutyl ketone, 1-methyl-2-pyrrolidone and acetone; ether-based solvents such as cyclohexanone, tetrahydrofuran and isopropyl ether; acetate-based solvents such as ethyl acetate, butyl acetate and propylene glycol methyl ether acetate; alcohol-based solvents such as isopropyl alcohol and butyl alcohol; amide-based solvents such as dimethylacetamide and dimethylformamide; silicon-based solvents; and mixtures thereof.

In the preparation of the liquid coating composition, the organic solvent should be used in an amount sufficient to apply the solid components including the siloxane-based resin and the porogen evenly to the surface of a wafer. Thus, the organic solvent should amount to 20–99.9 wt %, preferably 70–95 wt % of the liquid coating composition. If the organic solvent content of the liquid coating composition is less than 20 wt %, part of the siloxane-based resin remains undissolved. On the other hand, if the organic solvent content is more than 99.9 wt %, the final resinous film is as thin as 1000 Å or less.

In the present invention, the liquid coating composition thus prepared can be applied to a silicon wafer according to various coating methods well known in the art. Non-limiting examples of the coating method useful in the present invention include spin-coating, dip-coating, spray-coating, flow-coating and screen-printing, while spin-coating is most preferred.

The present invention can be more clearly understood with referring to the following examples. It should be understood that the following examples are not intended to restrict the scope of the present invention in any manner.

EXAMPLE 1

Synthesis of Siloxane Monomer

EXAMPLE 1-1

Synthesis of Cyclic Siloxane Monomer (A)

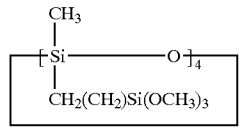

To a flask were introduced 10.0 g(29.014 mmol) of 2,4,6,8-tetramethyl-2,4,6,8-tetravinylcyclotetrasiloxane and 0.164 g of platinum(O)-1,3-divinyl-1,1,3,3-tetramethyldisiloxane complex(solution in xylene), and then diluted with 300 ml of diethylether. Next, the flask was cooled to −78° C., 17.29 g(127.66 mmol) of trichlorosilane was slowly added thereto, and it was slowly warmed to room temperature. The reaction was continued at room temperature for 20 hrs, and volatile materials were removed from the reaction mixture under a reduced pressure of about 0.1 Torr. To the reaction mixture was added 100 ml of pentane and stirred for 1 hr, followed by filtering through celite to afford a colorless, clear solution. From the solution was then removed toluene under a reduced pressure to afford a liquid compound represented by the formula [—Si(CH$_3$)(CH$_2$CH$_2$SiCl$_3$)O—]$_4$ in a yield of 95%. 10.0 g(11.28 mmol) of the liquid compound was diluted with 500 ml of tetrahydrofuran, and 13.83 g(136.71 mmol) of triethylamine was added thereto. Thereafter, the mixture was cooled to −78° C., 4.38 g(136.71 mmol) of methyl alcohol was slowly added thereto, and it was slowly warmed to room temperature. The reaction was continued at room temperature for 15 hrs and filtered through celite, and then volatile materials were evaporated from the resulting filtrate under a reduced pressure of about 0.1 Torr. Subsequently, 100 ml of pentane was added to the remaining filtrate and stirred for 1 hr, followed by filtering through celite. To the filtrate was added 5 g of activated carbon and stirred for 10 hrs. Filtrate obtained from the filtration of the stirred solution was subjected to a reduced pressure to remove hexane therefrom and afford monomer (A) as a colorless liquid. The results obtained from NMR analysis of this monomer dissolved in CDCl$_3$ are as follows:

$^1$H-NMR(300 MHz): δ 0.09 (s, 12H, 4×CH$_3$), 0.52–0.64 (m, 16 H, 4×CH$_2$CH$_2$—), 3.58 (s, 36H, 4×[OCH$_3$]$_3$)

EXAMPLE 1-2

Synthesis of Linear Siloxane Monomer (B)

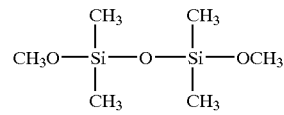

To a flask was introduced 10.0 g(249.208 mmol) of 1,3-dichlorotetramethyldisiloxane, and then diluted with 500 ml of tetrahydrofuran. Next, the flask was cooled to −78° C., 10.95 g(108.212 mmol) of triethylamine was added thereto, followed by the slow addition of 3.46 g(107.90 mmol) of methyl alcohol. Then the reaction temperature was slowly elevated to room temperature. The reaction was continued at room temperature for 15 hrs. At the completion of the reaction, the reaction mixture was filtered through celite, and volatile materials were removed from the filtrate under a reduced pressure of about 0.1 Torr. To the remaining filtrate was added 100 ml of hexane and stirred for 1 hr, followed by filtering through celite. From the filtrate was then removed hexane under a reduced pressure to afford a colorless liquid. Colorless liquid monomer (B) was obtained from simple distillation of the liquid. The results obtained from NMR analysis of this monomer dissolved in CDCl$_3$ are as follows:

$^1$H-NMR(300 MHz): δ 0.068 (s, 12H, 4×CH$_3$), 3.45 (s, 6H, 2×OCH$_3$)

EXAMPLE 1-3

Synthesis of Linear Siloxane Monomer (C)

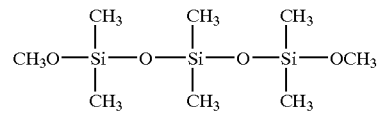

Example 1-3 was carried out according to the same manner as in the above Example 1-2, except that 1,3-dichlorotetramethyldisiloxane was replaced with 1,5-dichlorohexamethyltrisiloxane.

The results obtained from NMR analysis of the monomer (C) thus prepared and dissolved in CDCl$_3$ are as follows:

$^1$H-NMR(300 MHz): δ 0.068 (s, 12H, 4×CH$_3$), 0.077 (s, 3H, —CH$_3$), 3.44 (s, 6H, 2×OCH$_3$)

EXAMPLE 1-4

Synthesis of Linear Siloxane Monomer (D)

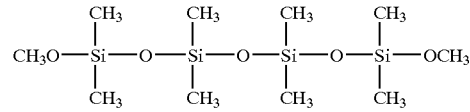

Example 1-4 was carried out according to the same manner as in the above Example 1-2, except that 1,3-dichlorotetramethyldisiloxane was replaced with 1,7-dichlorooctamethyltetrasiloxane.

The results obtained from NMR analysis of the monomer (C) thus prepared and dissolved in $CDCl_3$ are as follows:

$^1$H-NMR(300 MHz): δ 0.068 (s, 24H, 8×$CH_3$), 3.45 (s, 6H, 2×$OCH_3$)

EXAMPLE 1-5

Synthesis of Linear Siloxane Monomer (E)

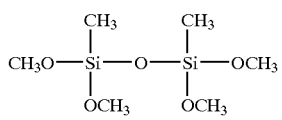

The linear siloxane monomer (E) was obtained from Sigma Aldrich(U.S.A.).

EXAMPLE 2

Synthesis of Siloxane-Based Resins (a)–(m)

The cyclic siloxane monomer (A) and one of the linear siloxane monomers (B) through (E) obtained from the above Example 1 were quantified respectively according to Table 1 below and introduced to a flask, followed by dilution with 15× tetrahydrofuran. Subsequently, after cooling the flask down to −78° C., certain amounts of deionized water and HCl were slowly added thereto. Then, the flask was warmed to 70° C., at which temperature the flask was left for 20 hrs so that the reaction could continue. At the completion of the reaction, the reaction mixture was transferred to a separatory funnel, followed by addition of diethylether and tetrahydrofuran as much as the tetrahydrofuran used in the previous dilution of the monomer. Then, 3×washing was conducted, each round with water one tenth as much as the total solution in the separatory funnel. After washing, volatile materials were evaporated from the remaining solution to afford white powdery polymers. The powder was completely dissolved in a small amount of acetone to obtain a clear solution, and this solution was filtered through a 0.2 μm syringe filter so as to remove impurities to provide a clear filtrate, to which was then slowly added deionized water. As a result, white powdery material was formed, which was then separated from the liquid phase(mixed solution of acetone and water) and dried for 10 hrs at a temperature of 0–20° C. under a reduced pressure of about 0.1 Torr to afford a fractionated siloxane-based resin.

TABLE 1

| | Monomer(mmol) | | | | | | | |
|---|---|---|---|---|---|---|---|---|
| Resin | Monomer (A) | Monomer (B) | Monomer (C) | Monomer (D) | Monomer (E) | HCl (mmol) | $H_2O$ (mmol) | Yield (g) |
| (a) | 6.621 | 15.450 | | | | 0.110 | 310 | 4.85 |
| (b) | 15.450 | 15.450 | | | | 0.216 | 721 | 9.70 |
| (c) | 11.998 | 5.142 | | | | 0.145 | 514 | 6.85 |
| (d) | 11.998 | | 5.142 | | | 0.145 | 514 | 6.70 |
| (e) | 11.998 | | | 5.142 | | 0.145 | 514 | 7.55 |
| (f) | 11.998 | | | 5.142 | | 0.145 | 857 | 7.60 |
| (g) | 11.998 | | | 5.142 | | 1.450 | 514 | 7.85 |
| (h) | 11.998 | | | 5.142 | | 0.101 | 514 | 7.80 |
| (i) | 11.998 | | | 5.142 | | 0.080 | 514 | 7.10 |
| (j) | 11.998 | | | 5.142 | | 0.048 | 514 | 6.35 |
| (k) | 9.599 | | | | 22.397 | 0.102 | 627 | 7.53 |
| (l) | 7.199 | | | | 28.796 | 0.101 | 617 | 7.56 |
| (m) | 4.799 | | | | 43.194 | 0.115 | 705 | 7.71 |

EXAMPLE 3

Analysis of the Composition of Resins

The respective siloxane-based resins obtained from the above Example 2 were analyzed for Si—OH, Si—$OCH_3$ and Si—$CH_3$ content, as described below. The results are set forth in Table 2.

TABLE 2

| Resin | Si—OH (%) | Si—$OCH_3$ (%) | Si—$CH_3$ (%) |
|---|---|---|---|
| (a) | 6.2 | 0.3 | 93.5 |
| (b) | 14.3 | 0.5 | 85.1 |
| (c) | 28.6 | 0.7 | 70.7 |
| (d) | 30.6 | 1.0 | 68.4 |
| (e) | 28.1 | 0.9 | 71.0 |
| (f) | 29.9 | 0.6 | 69.5 |
| (g) | 18.3 | 0.7 | 81.0 |
| (h) | 32.4 | 0.9 | 66.7 |
| (i) | 33.3 | 1.0 | 65.7 |
| (j) | 41.2 | 1.4 | 57.4 |
| (k) | 33.2 | 1.8 | 65.0 |
| (l) | 32.1 | 1.5 | 66.4 |
| (m) | 27.3 | 1.5 | 71.2 |

The Si—OH, Si—$OCH_3$ and Si—$CH_3$ content(%) was obtained using NMR(Bruker Co.) and the following equations:

Si—OH(%)=Area(Si—OH)÷[Area(Si—OH)+Area (Si—$OCH_3$)/3+Area (Si—$CH_3$)/3]×100

Si—$OCH_3$(%)=Area(Si—$OCH_3$)/3÷[Area(Si—OH)+ Area(Si—$OCH_3$)/ 3+Area(Si—$CH_3$)/3]×100

Si—$CH_3$(%)=Area(Si—$CH_3$)/3÷[Area(Si—OH)+ Area(Si—$OCH_3$) /3+Area(Si—$CH_3$)/3]×100

EXAMPLE 4

Measurement of Thickness and Refractive Index of Resinous Film

The siloxane-based resins obtained from the above Example 2, and their mixture with heptakis(2,3,6-tri-O-methoxy)-β-cyclodextrin were dissolved in propylene glycol methyl ether acetate(PGMEA), respectively, so that final concentration of the solid matter in the resulting liquid coating compositions was 25 wt %. Each of the coating compositions was then spin-coated onto a silicon wafer for 30 seconds with maintaining the spin rate of 3,000 rpm. In a nitrogen atmosphere, the coated wafers were subjected to the sequential soft baking on a hot plate(1 min at 100° C. and another minute at 250° C.) so as to evaporate the organic solvent sufficiently. Thereafter, the temperature was elevated to 420° C. at a rate of 3° C./min under vacuum condition, at which temperature the coating films were allowed to cure for 1 hr to afford test pieces.

Each of the test pieces thus prepared was analyzed for film thickness and refractive index. The film thickness and the refractive index were measured at 5 different points every test piece by the use of a profiler and a prism coupler, respectively. The mean thickness and refractive index are set forth in Table 3 along with their uniformity.

TABLE 3

| Composition of resinous film | | Thickness (Å) | R.I.* | Uniformity of R.I.* (%) | Uniformity of thickness (%) |
|---|---|---|---|---|---|
| Resin | Resin (wt %) | Porogen (wt %) | | | |
| (a) | 100 | — | 9647 | 1.4056 | 0.074 | 2.09 |
| (a) | 70 | 30 | 8946 | 1.3614 | 0.158 | 1.53 |
| (b) | 100 | — | 11665 | 1.4204 | 0.049 | 0.45 |
| (b) | 70 | 30 | 9283 | 1.3412 | 0.037 | 1.99 |
| (c) | 100 | — | 10193 | 1.4299 | 0.031 | 0.62 |
| (c) | 70 | 30 | 8983 | 1.3298 | 0.105 | 1.81 |
| (d) | 100 | — | 11131 | 1.4355 | 0.010 | 0.45 |
| (d) | 70 | 30 | 10075 | 1.3278 | 0.196 | 1.10 |
| (e) | 100 | — | 10289 | 1.4395 | 0.052 | 2.56 |
| (e) | 70 | 30 | 9604 | 1.3202 | 0.216 | 2.34 |
| (f) | 100 | — | 12051 | 1.4358 | 0.081 | 1.23 |
| (f) | 70 | 30 | 7540 | 1.3290 | 0.107 | 1.57 |
| (g) | 100 | — | 13453 | 1.4207 | 0.047 | 0.92 |
| (g) | 70 | 30 | 8829 | 1.3385 | 0.089 | 1.04 |
| (h) | 100 | — | 12011 | 1.4397 | 0.023 | 1.38 |
| (h) | 70 | 30 | 9739 | 1.3225 | 0.059 | 1.97 |
| (i) | 100 | — | 11513 | 1.4403 | 0.072 | 2.52 |
| (i) | 70 | 30 | 8508 | 1.3217 | 0.126 | 1.48 |
| (j) | 100 | — | 12485 | 1.4454 | 0.032 | 0.72 |
| (j) | 70 | 30 | 9787 | 1.3170 | 0.089 | 0.91 |
| (k) | 100 | — | 10138 | 1.4249 | 0.081 | 1.31 |
| (k) | 70 | 30 | 9387 | 1.3128 | 0.031 | 1.02 |
| (l) | 100 | — | 7681 | 1.4190 | 0.076 | 1.30 |
| (l) | 70 | 30 | 7499 | 1.3065 | 0.030 | 0.94 |
| (m) | 100 | — | 8245 | 1.4086 | 0.082 | 1.05 |
| (m) | 70 | 30 | 7958 | 1.3206 | 0.028 | 0.75 |

*R.I.: Refractive index

EXAMPLE 5

Measurement of Dielectric Constant of Resinous Film

P-type silicon wafers doped with boron were coated with a 3000 Å thermally-oxidized silicon film, followed by sequential deposition of a 100 Å of titanium layer, a 2000 Å of aluminum layer and a 100 Å of titanium layer using a metal evaporator. On the surface of each of these wafers was formed a resinous film according to the same manner as in the above Example 4. Subsequently, on the resinous film was deposited a circular electrode of 1 m diameter which consists of a 100 Å-thick titanium layer and a 5000 Å-thick aluminum layer through a hard mask so as to provide a test piece having MIM(metal-insulator-metal) structure. Test pieces thus prepared were subjected to measurement of capacitance at 100 kHz using PRECISION LCR METER (HP4284A) with Micromanipulator 6200 probe station. Dielectric constant of each test film was calculated from the following equation, wherein "d" value was obtained by the use of an ellipsometer:

$$k = (C \times d)/(\epsilon_o \times A)$$

note) k: dielectric ratio
C: capacitance
d: film thickness
$\epsilon_o$: dielectric constant in vacuum
A: contact area of the electrode The calculated dielectric constants are set forth in Table 4.

TABLE 4

| | Composition of resinous film | | |
|---|---|---|---|
| Resin | Resin (wt %) | Porogen (wt %) | Dielectric constant |
| (a) | 100 | — | 2.83 |
| (a) | 70 | 30 | 2.67 |
| (b) | 100 | — | 2.72 |
| (b) | 70 | 30 | 2.23 |
| (c) | 100 | — | 2.74 |
| (c) | 70 | 30 | 2.37 |
| (d) | 100 | — | 2.79 |
| (d) | 70 | 30 | 2.25 |
| (e) | 100 | — | 2.71 |
| (e) | 70 | 30 | 2.17 |
| (f) | 100 | — | 2.78 |
| (f) | 70 | 30 | 2.19 |
| (g) | 100 | — | 2.80 |
| (g) | 70 | 30 | 2.28 |
| (h) | 100 | — | 2.80 |
| (h) | 70 | 30 | 2.21 |
| (i) | 100 | — | 2.81 |
| (i) | 70 | 30 | 2.20 |
| (j) | 100 | — | 2.66 |
| (j) | 70 | 30 | 2.10 |
| (k) | 100 | — | 2.76 |
| (k) | 70 | 30 | 2.26 |
| (l) | 100 | — | 2.75 |
| (l) | 70 | 30 | 2.26 |
| (m) | 100 | — | 2.71 |
| (m) | 70 | 30 | 2.20 |

EXAMPLE 6

Measurement of Mechanical Proportions of Resinous Film

Test pieces prepared as in the above Example 4 were analyzed for hardness and elastic modulus using Nanoindenter II(MTS Co.). The resinous film of each test piece was indented until the indentation depth reached 10% of its whole thickness. At this time, to secure the reliability of this measurement, 6 points were indented every test piece, and mean hardness and modulus were taken. The results are set forth in Table 5.

TABLE 5

| | Composition of resinous film | | | |
|---|---|---|---|---|
| Resin | Resin (wt %) | Porogen (wt %) | Hardness (GPa) | Modulus (GPa) |
| (a) | 100 | — | 0.40 | 2.47 |
| (a) | 70 | 30 | 0.27 | 2.06 |
| (b) | 100 | — | 0.59 | 3.62 |
| (b) | 70 | 30 | 0.39 | 2.46 |
| (c) | 100 | — | 1.00 | 5.33 |
| (c) | 70 | 30 | 0.51 | 2.84 |
| (d) | 100 | — | 0.97 | 5.44 |
| (d) | 70 | 30 | 0.44 | 2.57 |
| (e) | 100 | — | 1.19 | 6.27 |
| (e) | 70 | 30 | 0.48 | 2.70 |
| (f) | 100 | — | 1.12 | 6.01 |
| (f) | 70 | 30 | 0.52 | 3.18 |
| (g) | 100 | — | 0.70 | 3.97 |
| (g) | 70 | 30 | 0.37 | 2.60 |
| (h) | 100 | — | 1.24 | 6.72 |
| (h) | 70 | 30 | 0.47 | 2.93 |
| (i) | 100 | — | 1.25 | 6.58 |
| (i) | 70 | 30 | 0.48 | 2.98 |
| (j) | 100 | — | 1.33 | 6.97 |
| (j) | 70 | 30 | 0.50 | 3.00 |
| (k) | 100 | — | 1.15 | 6.33 |
| (k) | 70 | 30 | 0.40 | 2.51 |
| (l) | 100 | — | 1.11 | 5.94 |
| (l) | 70 | 30 | 0.39 | 2.78 |
| (m) | 100 | — | 1.04 | 5.50 |
| (m) | 70 | 30 | 0.36 | 2.46 |

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of forming an insulating film between interconnect layers of a semiconductor device comprising the steps of:
   providing a liquid coating composition by dissolving a siloxane-based resin in an organic solvent;
   coating a silicon wafer with the liquid coating composition to form a coating film thereon; and
   heat-curing the coating film,
   wherein the siloxane-based resin is prepared by hydrolyzing and polycondensing a first monomer of the formula (1) and a second monomer of the formula (2) in an organic solvent in the presence of an acid or alkaline catalyst and water:

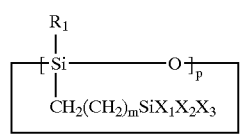

(1)

wherein,
   $R_1$ is H, $C_{1-3}$ alkyl or $C_{6-15}$ aryl;
   each of $X_1$, $X_2$ and $X_3$, independently, is $C_{1-3}$ alkyl, $C_{1-10}$ alkoxy or halogen, provided that at least one of them is hydrolysable;
   m is an integer from 0 to 10; and
   p is an integer from 3 to 8; and

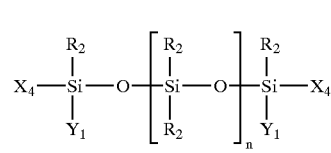

(2)

wherein,
   $R_2$ is H, $C_{1-3}$ alkyl or $C_{6-5}$ aryl;
   $X_4$ is $C_{1-10}$ alkoxy;
   $Y_1$ is $C_{1-3}$ alkyl or $C_{1-10}$ alkoxy; and
   n is an integer from 0 to 10.

2. The method according to claim 1, wherein the siloxane-based resin is mixed with a porogen so that a weight ratio of the resin to the porogen is 99:1–30:70.

3. The method according to claim 1, wherein the porogen is selected from the group consisting of cyclodextrin, polycaprolactone, and a derivative thereof.

4. The method according to claim 1, wherein the organic solvent is selected from the group consisting of an aliphatic hydrocarbon solvent, an aromatic hydrocarbon solvent, a ketone-based solvent, an ether-based solvent, an acetate-based solvent, an alcohol-based solvent, an amide-based solvent, a silicon-based solvent, and mixtures thereof.

5. The method according to claim 1, wherein the organic solvent is 20–99.9 wt % of the liquid coating composition.

6. The method according to claim 1, wherein the liquid coating composition is applied to the silicon wafer by spin-coating.

7. The method according to claim 1, wherein the heat-curing is conducted at a temperature of 150–6000° C. for 1–150 minutes.

8. An interlayer insulating film made from a siloxane-based resin, wherein micropores are formed throughout the film by the use of a porogen,
   wherein the siloxane-based resin is prepared by hydrolyzing and polycondensing a first monomer of the formula (1) and a second monomer of the formula (2) in an organic solvent in the presence of an acid or alkaline catalyst and water:

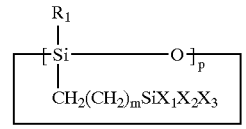

(1)

wherein,
   $R_1$ is H, $C_{1-3}$ alkyl or $C_{6-15}$ aryl;
   each of $X_1$, $X_2$ and $X_3$, independently, is $C_{1-3}$ alkyl, $C_{1-10}$ alkoxy or halogen, provided that at least one of them is hydrolysable;

m is an integer from 0 to 10; and p is an integer from 3 to 8; and (2)

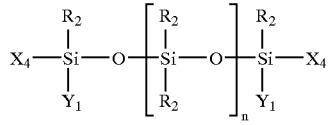

wherein,

R$_2$ is H, C$_{1-3}$ alkyl or C$_{6-15}$ aryl;

X$_4$ is C$_{1-10}$ alkoxy;

Y$_1$ is C$_{1-3}$ alkyl or C$_{1-10}$ alkoxy; and n is an integer from 0 to 10.

9. The interlayer insulating film according to claim 8, wherein the porogen is selected from a group consisting of cyclodextrin, polycaprolactone, and derivatives thereof.

10. A semiconductor device containing an insulating film made from a siloxane-based resin prepared by hydrolyzing and polycondensing a first monomer of the formula (1) and a second monomer of the formula (2) in an organic solvent in the presence of an acid or alkaline catalyst and water:

(1)

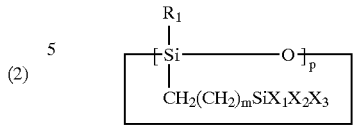

wherein,
R$_1$ is H, C$_{1-3}$ alkyl or C$_{6-15}$ aryl; each of X$_1$, X$_2$ and X$_3$, independently, is C$_{1-3}$ alkyl, C$_{1-10}$ alkoxy or halogen, provided that at least one of them is hydrolysable;
m is an integer from 0 to 10; and
p is an integer from 3 to 8; and (2)

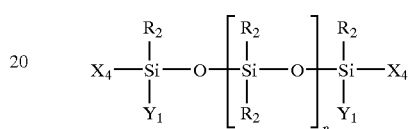

wherein
R$_2$ is H, C$_{1-3}$ alkyl or C$_{6-15}$ aryl;
X$_4$ is C$_{1-10}$ alkoxy;
Y$_1$ is C$_{1-3}$ alkyl or C$_{1-10}$ alkoxy; and
n is an integer from 0 to 10.

\* \* \* \* \*